US008808799B2

(12) United States Patent  
Madigan et al.

(10) Patent No.: US 8,808,799 B2
(45) Date of Patent: Aug. 19, 2014

(54) METHOD AND APPARATUS FOR ORGANIC VAPOR PRINTING

(75) Inventors: Conor F. Madigan, San Francisco, CA (US); Alexander Sou-Kang Ko, Santa Clara, CA (US); Jianglong Chen, San Jose, CA (US)

(73) Assignee: Kateeva, Inc., Menlo Park, CA (US)

( * ) Notice: Subject to any disclaimer, the term of this patent is extended or adjusted under 35 U.S.C. 154(b) by 743 days.

(21) Appl. No.: 12/772,184

(22) Filed: May 1, 2010

(65) Prior Publication Data

US 2011/0008541 A1 Jan. 13, 2011

Related U.S. Application Data

(60) Provisional application No. 61/174,943, filed on May 1, 2009.

(51) Int. Cl.
| C23C 16/00 | (2006.01) |
| B05D 5/06 | (2006.01) |
| C23C 14/24 | (2006.01) |
| C23C 14/22 | (2006.01) |
| C23C 14/04 | (2006.01) |
| C23C 14/12 | (2006.01) |
| H01L 51/00 | (2006.01) |
| H01L 51/56 | (2006.01) |

(52) U.S. Cl.
CPC ............ *H01L 51/0008* (2013.01); *C23C 14/24* (2013.01); *C23C 14/228* (2013.01); *C23C 14/04* (2013.01); *C23C 14/12* (2013.01); *H01L 51/0013* (2013.01); *H01L 51/56* (2013.01); *H01L 51/0011* (2013.01)
USPC .................................... 427/255.6; 427/248.1

(58) Field of Classification Search
None
See application file for complete search history.

(56) References Cited

U.S. PATENT DOCUMENTS

| 4,238,807 A | 12/1980 | Bovio et al. |
| 4,751,531 A | 6/1988 | Saito et al. |
| 5,116,148 A | 5/1992 | Ohara et al. |
| 5,155,502 A | 10/1992 | Kimura et al. |
| 5,172,139 A | 12/1992 | Sekiya et al. |
| 5,202,659 A | 4/1993 | DeBonte et al. |
| 5,247,190 A | 9/1993 | Friend et al. |

(Continued)

FOREIGN PATENT DOCUMENTS

| EP | 1 626 103 | 2/2006 |
| JP | 06-122201 | 5/1994 |

(Continued)

OTHER PUBLICATIONS

Chin, Byung Doo, "Effective Hole Transport Layer Structure for Top Emitting Devices Based on Laser Transfer Patterning," *Journal of Physics D: Applied Physics*, 2007, vol. 40, pp. 5541-5546.

(Continued)

*Primary Examiner* — Joseph Miller, Jr.

(57) ABSTRACT

In one embodiment, the disclosure relates to providing a first gas stream carrying vaporized material and depositing the vaporized material onto a substrate by directing a plurality of gas streams containing the vaporized material to a substrate, forming an gas curtain around the streams to prevent its dissemination beyond a target print area, and allowing the vaporized material to condense on the target print area. In another embodiment, heat is used to regulate the flow of the material and the thickness of the deposited layer.

19 Claims, 16 Drawing Sheets

(56) References Cited

U.S. PATENT DOCUMENTS

Figure 1:
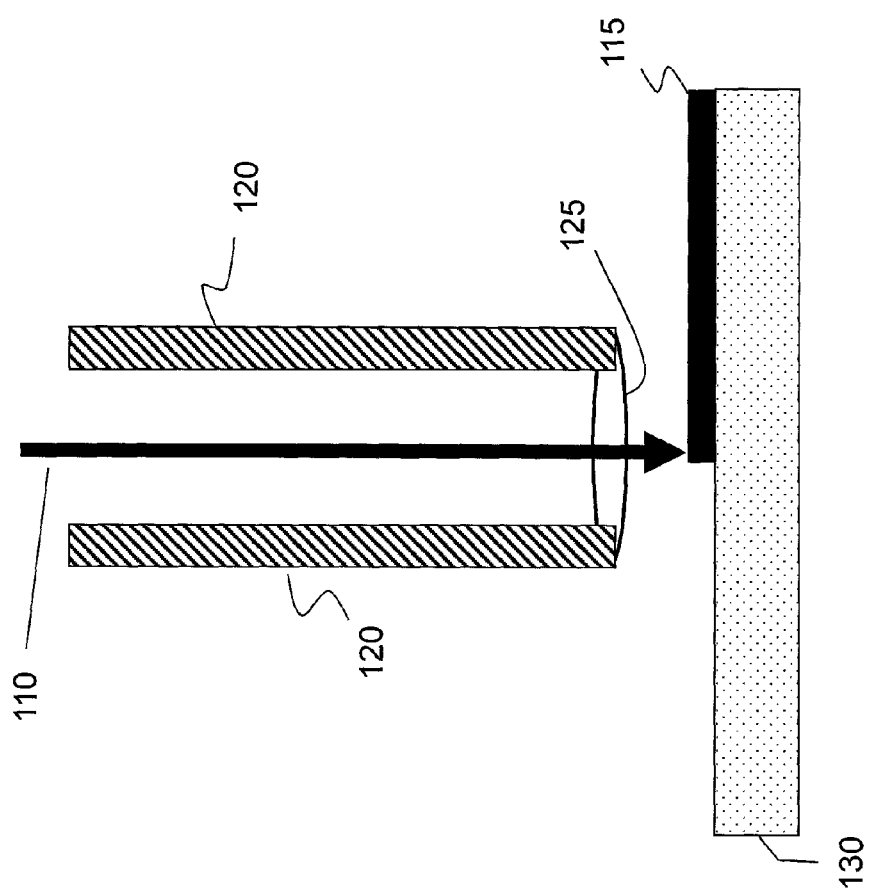

| | | | |
|---|---|---|---|
| 5,405,710 A | 4/1995 | Dodabalapur et al. | |
| 5,574,485 A | 11/1996 | Anderson et al. | |
| 5,623,292 A | 4/1997 | Shrivastava | |
| 5,703,436 A | 12/1997 | Forrest et al. | |
| 5,707,745 A | 1/1998 | Forrest et al. | |
| 5,731,828 A | 3/1998 | Ishinaga et al. | |
| 5,781,210 A | 7/1998 | Hirano et al. | |
| 5,801,721 A | 9/1998 | Gandy et al. | |
| 5,834,893 A | 11/1998 | Bulovic et al. | |
| 5,844,363 A | 12/1998 | Gu et al. | |
| 5,865,860 A | 2/1999 | Delnick | |
| 5,947,022 A | 9/1999 | Freeman et al. | |
| 5,956,051 A | 9/1999 | Davies et al. | |
| 6,013,982 A | 1/2000 | Thompson et al. | |
| 6,065,825 A | 5/2000 | Anagnostopoulos et al. | |
| 6,086,195 A | 7/2000 | Bohorquez et al. | |
| 6,086,196 A | 7/2000 | Ando et al. | |
| 6,086,679 A | 7/2000 | Lee et al. | |
| 6,087,196 A | 7/2000 | Sturm et al. | |
| 6,091,195 A | 7/2000 | Forrest et al. | |
| 6,095,630 A | 8/2000 | Horii et al. | |
| 6,097,147 A | 8/2000 | Baldo et al. | |
| 6,189,989 B1 | 2/2001 | Hirabayashi et al. | |
| 6,250,747 B1 | 6/2001 | Hauck | |
| 6,257,706 B1 | 7/2001 | Ahn | |
| 6,294,398 B1 | 9/2001 | Kim et al. | |
| 6,303,238 B1 | 10/2001 | Thompson et al. | |
| 6,312,083 B1 | 11/2001 | Moore | |
| 6,326,224 B1 | 12/2001 | Xu et al. | |
| 6,337,102 B1 | 1/2002 | Forrest et al. | |
| 6,431,702 B2 | 8/2002 | Ruhe | |
| 6,444,400 B1 | 9/2002 | Cloots et al. | |
| 6,453,810 B1 | 9/2002 | Rossmeisl et al. | |
| 6,460,972 B1 | 10/2002 | Trauernicht et al. | |
| 6,468,819 B1 | 10/2002 | Kim et al. | |
| 6,472,962 B1 | 10/2002 | Guo et al. | |
| 6,498,802 B1 | 12/2002 | Chu et al. | |
| 6,513,903 B2 | 2/2003 | Sharma et al. | |
| 6,548,956 B2 | 4/2003 | Forrest et al. | |
| 6,562,405 B2 | 5/2003 | Eser et al. | |
| 6,576,134 B1 | 6/2003 | Agner | |
| 6,586,763 B2 | 7/2003 | Marks et al. | |
| 6,601,936 B2 | 8/2003 | McDonald | |
| 6,666,548 B1 | 12/2003 | Sadasivan et al. | |
| 6,811,896 B2 | 11/2004 | Aziz et al. | |
| 6,824,262 B2 | 11/2004 | Kubota et al. | |
| 6,861,800 B2 | 3/2005 | Tyan et al. | |
| 6,896,346 B2 | 5/2005 | Trauernicht et al. | |
| 6,911,671 B2 | 6/2005 | Marcus et al. | |
| 6,917,159 B2 | 7/2005 | Tyan et al. | |
| 6,982,005 B2 | 1/2006 | Eser et al. | |
| 7,023,013 B2 | 4/2006 | Ricks et al. | |
| 7,077,513 B2 | 7/2006 | Kimura et al. | |
| 7,247,394 B2 | 7/2007 | Hatwar et al. | |
| 7,374,984 B2 | 5/2008 | Hoffman | |
| 7,377,616 B2 | 5/2008 | Sakurai | |
| 7,404,862 B2 | 7/2008 | Shtein et al. | |
| 7,406,761 B2 | 8/2008 | Jafri et al. | |
| 7,410,240 B2 | 8/2008 | Kadomatsu et al. | |
| 7,431,435 B2 | 10/2008 | Lopez et al. | |
| 7,431,968 B1 | 10/2008 | Shtein et al. | |
| 7,530,778 B2 | 5/2009 | Yassour et al. | |
| 7,603,439 B2 | 10/2009 | Dilley et al. | |
| 7,604,439 B2 | 10/2009 | Yassour et al. | |
| 7,648,230 B2 | 1/2010 | Kachi | |
| 7,677,690 B2 | 3/2010 | Takatsuka | |
| 7,802,537 B2 | 9/2010 | Kang et al. | |
| 7,857,121 B2 | 12/2010 | Yassour | |
| 7,883,832 B2 | 2/2011 | Colburn et al. | |
| 7,908,885 B2 | 3/2011 | Devitt | |
| 8,128,753 B2 | 3/2012 | Bulovic et al. | |
| 2001/0045973 A1 | 11/2001 | Sharma et al. | |
| 2002/0008732 A1 | 1/2002 | Moon et al. | |
| 2002/0191063 A1 | 12/2002 | Gelbart et al. | |
| 2003/0230980 A1 | 12/2003 | Forrest et al. | |
| 2004/0009304 A1 | 1/2004 | Pichler | |
| 2004/0048000 A1 | 3/2004 | Shtein et al. | |
| 2004/0048183 A1 | 3/2004 | Teshima | |
| 2004/0056244 A1 | 3/2004 | Marcus et al. | |
| 2004/0062862 A1 | 4/2004 | Ahn et al. | |
| 2004/0086631 A1 | 5/2004 | Han | |
| 2004/0115339 A1* | 6/2004 | Ito | 427/66 |
| 2004/0202794 A1 | 10/2004 | Yoshida | |
| 2005/0005848 A1* | 1/2005 | Yamazaki et al. | 118/719 |
| 2005/0087131 A1* | 4/2005 | Shtein et al. | 118/715 |
| 2005/0190220 A1 | 9/2005 | Lim et al. | |
| 2005/0255249 A1 | 11/2005 | Schlatterbeck | |
| 2006/0012290 A1 | 1/2006 | Kang | |
| 2006/0115585 A1* | 6/2006 | Bulovic et al. | 427/180 |
| 2007/0040877 A1 | 2/2007 | Kachi | |
| 2007/0058010 A1 | 3/2007 | Nagashima | |
| 2007/0098891 A1 | 5/2007 | Tyan et al. | |
| 2007/0134512 A1 | 6/2007 | Klubek et al. | |
| 2007/0163497 A1* | 7/2007 | Grace et al. | 118/715 |
| 2007/0253686 A1* | 11/2007 | Wendt et al. | 392/388 |
| 2007/0286944 A1 | 12/2007 | Yokoyama et al. | |
| 2008/0044571 A1* | 2/2008 | Maltby | 427/255.5 |
| 2008/0152806 A1* | 6/2008 | Forrest et al. | 427/255.26 |
| 2008/0174235 A1 | 7/2008 | Kim et al. | |
| 2008/0238310 A1 | 10/2008 | Forrest et al. | |
| 2008/0299311 A1 | 12/2008 | Shtein et al. | |
| 2008/0308037 A1 | 12/2008 | Bulovic et al. | |
| 2008/0311289 A1 | 12/2008 | Bulovic et al. | |
| 2008/0311296 A1 | 12/2008 | Shtein et al. | |
| 2008/0311307 A1 | 12/2008 | Bulovic et al. | |
| 2009/0031579 A1 | 2/2009 | Piatt et al. | |
| 2009/0045739 A1 | 2/2009 | Kho et al. | |
| 2009/0115706 A1 | 5/2009 | Hwang et al. | |
| 2009/0167162 A1 | 7/2009 | Liu et al. | |
| 2009/0220680 A1 | 9/2009 | Winters | |
| 2010/0055810 A1 | 3/2010 | Sung et al. | |
| 2010/0079513 A1 | 4/2010 | Taira et al. | |
| 2010/0171780 A1 | 7/2010 | Madigan et al. | |
| 2010/0188457 A1 | 7/2010 | Madigan et al. | |
| 2010/0201749 A1 | 8/2010 | Somekh et al. | |
| 2010/0310424 A1 | 12/2010 | Rose et al. | |
| 2011/0008541 A1 | 1/2011 | Madigan et al. | |
| 2011/0057171 A1 | 3/2011 | Adamovich et al. | |
| 2011/0181644 A1 | 7/2011 | Bulovic et al. | |
| 2011/0267390 A1 | 11/2011 | Bulovic et al. | |
| 2011/0293818 A1 | 12/2011 | Madigan et al. | |

FOREIGN PATENT DOCUMENTS

| | | |
|---|---|---|
| JP | 08-216401 | 8/1996 |
| JP | 09-248918 | 9/1997 |
| JP | 2002-069650 | 3/2002 |
| JP | 2005-286069 | 10/2005 |
| JP | 2006-123551 | 5/2006 |
| JP | 2006-150900 | 6/2006 |
| JP | 2007-076168 | 3/2007 |
| JP | 2007-095343 | 4/2007 |
| JP | 2007-299616 | 11/2007 |
| JP | 05-255630 | 10/2009 |
| KR | 100232852 | 12/1999 |
| KR | 10-2004-0028048 | 9/2002 |
| KR | 10-2008-0060111 | 7/2007 |
| WO | WO 2005/090085 | 9/2005 |

OTHER PUBLICATIONS

Elwenspoek et al., "Silicon Micromachining," Aug. 2004, Cambridge University, Cambridge, U.K. ISBN 0521607671. [Abstract].

C. Ducso, et al. "Porous Silicon Bulk Micromachining for Thermally Isolated Membrane Formation," *Sensors and Actuators A,* 1997, vol. 60, pp. 235-239.

C. Tsamis, et al. "Thermal Properties of Suspended Porous Microhotplates for Sensor Applications," *Sensor and Actuators B,* 2003, vol. 95, pp. 78-82.

J. Lee, et al. "Differential Scanning Calorimeter Based on Suspended Membrane Single Crystal Silicon Microhotplate," *Journal of Microelectromechanical Systems,* Dec. 2008, vol. 17, No. 6, pp. 1513-1525.

(56) References Cited

OTHER PUBLICATIONS

J. C. Belmonte, et al. "High-temperature Low-power Performing Micromachined Suspended Micro-hotplate for Gas Sensing Applications<" *Sensors and Actuators B,* 2006, vol. 114, pp. 826-835.

G.S. Chung, "Fabrication and Characterization of Micro-heaters with Low-power Consumption using SOI membrane and Trench Structures," *Sensors and Actuators A,* 2004, vol. 112, pp. 55-60.

Geffroy et al., "Organic Light-emitting Diode (OLED) Technology: Material Devices and Display Technologies," *Polymer International,* Jun. 2006, vol. 55, pp. 572-582 (Abstract Only).

Huang et al., "Reducing Blueshift of Viewing Angle for Top-Eimtting Organic Light-Emitting Devices," Dec. 6, 2008, 3 pages.

J. Lee, et al. "Cavity Effects on Light Extraction in Organic Light emitting Devices," *Applied Physics Letters,* Jan. 24, 2008, vol. 92, No. 3, 5 pages.

S.H. Kim et al. "Fabrication and Characterization of co-planar type MEMS Structures on SiO2/Si3N4 Membrane for Gas Sensors with Dispensing Method Guided by Micromachined Wells," Journal of Eletroceramics, Jun. 27, 2005, vol. 17, No. 2-4, pp. 995-998.

Street et al., "Jet Printing of Active-Matrix TFT Backplanes for Displays and Sensors", *IS&T Archiving,* Dec. 2005, vol. 20, No. 5, 16 pages.

Forrest, Stephen R., "The Path to Ubiquitous and Low-cost Organic Electronic Appliances on Plastic," *Nature,* Apr. 29, 2004, vol. 428, 8 pages.

Leblanc et al., "Micromachined Printheads for the Evaporative Patterning of Organic Materials and Metals," *Journal of Microelectromechanical Systems,* Apr. 2007, vol. 16, No. 2, 7 pp. 1-139.

Lindermann et al., "Thermal Bubble Jet Printhead with Integrated Nozzle Plate," *NIP20: International Conference on Digital Printing Technologies,* Oct. 2004, pp.834-839.

Chen, Jianglong, "Novel Patterning Techniques for Manufacturing Organic and Nanostructured Electronics," *M.S. Materials Science and Engineering,* Massachusetts Institute of Technology, 2003, pp. 1-206.

Chen, Jingkuang et al., "A High-Resolution Silicon Monolithic Nozzle Array for Inkjet Printing," *IEEE Transactions on Electron Devices,* vol. 44, No. 9, Sep. 1997, pp. 1401-1409.

Chen et al., "Evaporative Deposition of Molecular Organics in Ambient with a Molecular Jet Printer," *Digital Fabrication,* Sep. 2006, pp. 63-65.

Chen et al., "Ambient Environment Patterning of Organic Thin Films by a Second Generation Molecular Jet (MoJet) Printer," *Progress Report 2006-2007,* Oct. 2007, pp. 26-6; 26-7.

International Search Report issued on Dec. 15, 2010 for PCT Application No. PCT/US10/020144.

International Search Report issued on Sep. 2, 2010 for PCT Application No. PCT/US10/033315.

International Search Report and Written Opinion issued on Mar. 24, 2011 for PCT Application No. PCT/US10/058145.

International Preliminary Report on Patentability issued on Dec. 17, 2009 for PCT Application No. PCT/US08/66975.

International Preliminary Report on Patentability issued on Dec. 7, 2009 for PCT Application No. PCT/US08/066991.

International Preliminary Report on Patentability issued on Dec. 17, 2009 for PCT Application No. PCT/US08/67002.

EP Examination Report dated Jul. 30, 2010 issued for EP Patent Application 08771068.7.

CN Office Action dated Oct. 12, 2010 issued for CN Patent Application 200880020197.8.

EP Examination Report dated Jul. 13, 2010 issued for EP Patent Application 08771094.3.

CN Office Action dated Dec. 17, 2010 issued for CN Patent Application 200880020151.6.

CN Office Action dated Jan. 12, 2011 issued for CN Patent Application 200880019990.6.

EP Examination Report dated Jul. 13, 2010 issued for EP Patent Application 08771084.4.

CN Second Office Action dated Jun. 22, 2011 issued for CN Patent Application 200880020197.8.

A Notification of the First Office Action issued on Dec. 30, 2013, for the corresponding Chinese Patent Application CN 201312251402880.

\* cited by examiner

METHOD AND APPARATUS FOR ORGANIC VAPOR PRINTING

The instant application claims priority to provisional application No. 61/174,943, which was filed on May 1, 2009, the disclosure of which is incorporated herein in its entirety.

BACKGROUND

1. Field of the Invention

The disclosure relates to a method and apparatus for printing substantially uniform organic films over target print areas and having profiled edges. More specifically, the disclosure relates to novel method and apparatus for printing an organic film (interchangeably, layer) by providing vaporized material, distributing the vaporized material over a target area and condensing the vaporized material to form a substantially uniform film on the target area.

2. Description of Related Art

The manufacture of organic light emitting devices (OLEDs) requires depositing one or more organic films on a substrate and coupling the top and bottom of the film stack to electrodes. The film thickness is a prime consideration. The total layer stack thickness is about 100 nm and each layer is optimally deposited uniformly with an accuracy of better than +/−2%. Film purity is also important. Conventional devices form the film stack using one of two methods: (1) thermal evaporation of organic material in a relative vacuum environment and subsequent condensation of the organic vapor on the substrate; or, (2) dissolution of organic material into a solvent, coating the substrate with the resulting solution, and subsequent removal of the solvent.

Another consideration in depositing the organic thin films of an OLED is placing the films precisely at the desired location. There are two conventional technologies for performing this task, depending on the method of film deposition. For thermal evaporation, shadow masking is used to form OLED films of a desired configuration. Shadow masking techniques require placing a well-defined physical mask over a region of the substrate followed by depositing the film over the entire substrate area. Once deposition is complete, the shadow mask is removed. The regions exposed through the mask define the pattern of material deposited on the substrate. This process is inefficient, as the entire substrate must be coated, even though only the regions exposed through the shadow mask require a film. Furthermore, the shadow mask becomes increasingly coated with each use, and must eventually be discarded or cleaned. Finally, the use of shadow masks over large areas is made difficult by the need to use very thin masks (to achieve small feature sizes) that make said masks structurally unstable. However, the vapor deposition technique yields OLED films with high uniformity and purity and adequate thickness control.

For solvent deposition, ink jet printing can be used to deposit patterns of OLED films. Ink jet printing requires dissolving organic material into a solvent that yields a printable ink. Furthermore, ink jet printing is conventionally limited to the use of one or two layer OLED film stacks, which typically have lower performance as compared to four for five layer film stacks used in vapor deposited devices. The stack limitation arises because printing typically causes destructive dissolution of any underlying organic layers. Consequently, one must engineer each layer such that it is undamaged by the wet deposition of each subsequent layer, and this greatly constrains the material and stack options. Finally, unless the substrate is first prepared with defined regions that contain the ink within the areas where the films are to be deposited, a step that increases the cost and complexity of the process, ink jet printing has very poor thickness uniformity as compared to vapor deposited films. The material quality is also typically lower, due to structural changes in the material that occur during the drying process and due to material impurities present in the ink. However, the ink jet printing technique is capable of providing patterns of OLED films over very large areas with good material efficiency.

No conventional technique combines the large area patterning capabilities of ink jet printing with the high uniformity, purity, and thickness control achieved with vapor deposition for organic thin films. Because ink jet processed OLED devices continue to have inadequate quality for widespread commercialization, and thermal evaporation remains too expensive and impractical for scaling to large areas, it is a major technological challenge for the OLED industry to develop a technique that can offer both high film quality and cost-effective large area scalability.

Finally, manufacturing OLED displays may also require the patterned deposition of thin films of metals, inorganic semiconductors, and/or inorganic insulators. Conventionally, vapor deposition and/or sputtering have been used to deposit these layers. Patterning is accomplished using prior substrate preparation (e.g., patterned coating with an insulator), shadow masking as described above, and when a fresh substrate or protective layers are employed, conventional photolithography. Each of these approaches is inefficient as compared to the direct deposition of the desired pattern, either because it wastes material or requires additional processing steps. Thus, there is a need for these materials as well for a method and apparatus for depositing high-quality, cost effective, large area scalable films.

SUMMARY

An apparatus for printing a uniform-thickness film on a substrate according to one embodiment of the disclosure includes: a nozzle for communicating a mixture of vaporized organic material and a carrier gas stream; a plurality of micropores communicating the mixture from the nozzle, the plurality of micropores arranged to provide a plurality of overlapping sub-streams; and a substrate for receiving and condensing the plurality of overlapping sub-streams into a film. The plurality of micropores can be independent of each other. At least two of the plurality of micropores can be connected to another by a cavity.

In another embodiment, the disclosure provides a method for printing a film having a substantially uniform thickness. The method includes providing a first gas stream carrying vaporized material. The vaporized material can comprise an organic ink composition. "Ink" is generally defined as any mixture having a volume of fluid components (in either the liquid or gas phase); examples of such generalized "inks" include mixtures of gaseous materials, mixtures of liquid particles suspended in a carrier gas, and mixtures of solid particles suspended in a carrier gas. The first gas steam can have a first temperature. The first gas stream can be divided into a plurality of sub-streams with each sub-stream carrying vaporized material. The sub-streams can have a shortest cross-sectional dimension on the microscale (that is, generally between 1 µm and 200 µm. (The sub-stream cross section is generally defined as the area of flow through the plane perpendicular average flow vector. For example, if the sub-stream flows through a long tube having a rectangular cross section with 3 um short side and 15 um long side, the cross section of the sub-stream is the rectangular cross section of the tube itself, and the shortest dimension of that cross-section is about 3 um. The sub-streams are then directed to a substrate. Simultaneously, a second gas stream can be directed to the substrate. The second gas stream forms a fluid curtain about the plurality of sub-streams to contain the vaporized material within a targeted region. The vaporized material condenses on the substrate, within the targeted region, to form a substantially solid film or layer. In a preferred embodiment, the substrate has a lower temperature than the vaporized material to expedite condensation. The fluid curtain can be positioned relative to the substrate and the sub-streams to allow formation of a printed layer having a substantially uniform film thickness. The fluid curtain can also be positioned relative to the substrate such that the film has a substantially profiled edges.

In another embodiment, the disclosure relates to a film deposition apparatus having a conduit for communicating a first gas stream carrying vaporized material. The first gas stream contains vaporized material of ink composition. A multipore nozzle can be placed in fluid communication with the conduit. The multipore nozzle divides the first gas stream into a plurality of micron-scale sub-streams with each sub-stream carrying the vaporized material. A secondary nozzle provides a gas curtain about the plurality of sub-streams. A substrate can be positioned relative to the multipore nozzle and the secondary nozzle to condensate the vaporized material of ink composition and thereby form a substantially solid film on a target print area. The plurality of sub-streams can also be positioned relative to each other and the fluid curtain to deposit a film having a substantially uniform film thickness with a profiled edge.

In still another embodiment, the disclosure relates to a method for printing a film of uniform thickness profile by: targeting a print area on a substrate; directing a first stream having a carrier gas and a quantity of organic material to the print area to deposit a layer of organic material on the substrate; addressing a second stream to the print area, the second stream targeting an edge of the print layer; wherein the first stream has a higher temperature than the substrate to thereby condense the organic material on the print area. In an exemplary implementation, the sub-streams overlap each other.

In yet another embodiment, the disclosure relates to an apparatus for forming a profiled edge on a print layer. The apparatus comprises: a first discharge nozzle for discharging a carrier gas containing a quantity of organic material in a plurality of sub-streams; a substrate for receiving and condensing the quantity of organic material onto a print layer having an edge, the substrate having a target print area; a second (auxiliary) discharge nozzle forming a fluid curtain over at least a portion of the target print area, the fluid curtain contacting an edge of the print layer to form a substantially profiled edge. The plurality of sub-streams can be positioned to deposit a film having a substantially uniform film thickness profile.

Another embodiment of the disclosure relates to a method for controlling organic material discharge from a nozzle. The method comprises the steps of: (a) supplying a carrier gas with an organic material to a discharge nozzle, the discharge nozzle having multiple pores; (b) forming a plurality of discharge streams at the discharge nozzle, each discharge stream having a quantity of organic material; (c) discharging the quantity of organic material from the discharge nozzle by heating the discharge nozzle; (d) condensing the organic material in the multiple pores of the discharge nozzle by removing heat from the discharge nozzle; (e) repeating steps (a) through (d) to control the deposition rate from the print nozzle.

An apparatus according to yet another embodiment of the disclosure comprises a discharge nozzle having a plurality of micropores; a conduit for communicating a carrier gas having a quantity of an organic material to a discharge nozzle; a heater for heating at least one of the micropores; and a controller for modulating the heater to communicate the quantity of organic material through the micropores or condense the quantity of organic material in the micropores.

In another embodiment, the disclosure relates to a method for printing a film having a profiled edge by delivering a carrier gas stream containing a vaporized organic material; distributing the gas stream and the vaporized material into a plurality of sub-streams, each sub-stream having a quantity of vaporized organic material; and directing the plurality of sub-streams to a substrate surface. The substrate surface condenses the quantity of vaporized material into a printed layer of organic material. The profiled edge can be defined as an edge connecting two substantially orthogonal edges of the deposited layer.

In still another embodiment, an array of multiple nozzles is formed for film deposition. The multi-nozzle array can include any number of nozzles. The number of nozzles can be determined by considerations such as the size of the targeted print area. Each nozzle may have a multipore discharge so as to provide overlapping or non-overlapping sub-streams.

BRIEF DESCRIPTION OF THE DRAWINGS

These and other embodiments of the disclosure will be discussed with reference to the following exemplary and non-limiting illustrations, in which like elements are numbered similarly, and where:

FIG. 1 schematically shows a conventional nozzle for depositing a film;

FIG. 2A illustrates printed profile of the nozzle of FIG. 1;

FIG. 2B illustrates the desired printed profile;

FIG. 3 shows lateral contamination caused by the conventional techniques;

FIG. 4 shows a multipore nozzle according to one embodiment of the disclosure;

FIGS. 5A-5C show several exemplary pore patterns;

FIGS. 6A-6C show complex pore patterns according to another embodiment of the disclosure;

FIG. 7 illustrates an exemplary array of multipore nozzles;

FIG. 8 shows an embodiment of the disclosure having auxiliary gas streams for a fluid curtain;

FIG. 9 illustrates a multipore assembly with a gas curtain according to one embodiment of the disclosure;

FIG. 10 is a cross-sectional view of the interface plate of FIG. 9;

FIG. 11 shows a multipore nozzle with a thermal shutter according to another embodiment of the disclosure;

FIG. 12 shows the multipore nozzle of FIG. 11 with the heater turned off;

FIG. 13 shows an exemplary nozzle having multiple orifices (or pores) for a fluid curtain;

FIG. 14 shows an exemplary nozzle with apertures for forming a fluid curtain;

FIG. 15 shows another exemplary discharge structure having multipore nozzles with two fluid ducts; and FIG. 16 shows an exemplary embodiment in which the micropores provide overlapping deposits.

DETAILED DESCRIPTION

Patterning of organic thin film is useful in variety of applications, including fabrication of light emitting displays. This is critical for OLED displays in particular because such displays require fabricating a number of patterned layers on a substrate. Each layer defines one of the colors: red, green and blue in each full color pixel. The patterning is performed using shadow mask evaporation. The shadow mask process is expensive and labor intensive. It is also prone to error and believed to be applicable only to relatively small areas.

The disclosed embodiments overcome the deficiencies of the conventional techniques by providing a method and apparatus for depositing patterned organic thin films at low cost over large areas that further offer good uniformity over the target printed area and, where required, sharp edge profiles. While the disclosure is described in the context of using a carrier gas to communicate organic vapor material, it should be noted that the disclosed principles are not limited to organic vapor material and can apply to all printing methods in which a carrier medium is used to convey the deposition material to a destination substrate.

In one embodiment, the disclosure relates to a structure for depositing a film of substantially uniform thickness by receiving a carrier gas stream containing organic vapor material at a nozzle, distributing the carrier gas stream into a plurality of sub-streams at a microscale distributor (interchangeably, micron-scale showerhead) and directing the sub-streams through a plurality of micropores onto a substrate. The substrate having a lower temperature relative to the carrier gas stream causes condensation of the organic vapor material. The micropores can be organized to such that the vapor stream from each micropore simultaneously delivers an overlapping deposit of organic material on the substrate. The cross section of the deposit from a single microscale distributor can have a continuous, non-zero cross section that can be controlled through the proper engineering of the size, shape and pattern of the micropores. Thus, in an inventive embodiment, multiple vapor streams (or sub-streams) are at least partially merged to form a uniform deposited film.

FIG. 1 schematically shows a conventional nozzle for depositing film. In conventional deposition techniques, a stream of heated carrier gas is used to convey vaporized organic material. In FIG. 1, stream 110 represents a carrier gas containing vaporized organic material. The vaporized organic material carried in stream 110 is deposited on the top surface of substrate 130 to form a layer of film 115. The conduit for conveying stream 110 to substrate 130 is schematically shown by walls 120. Thus, by using a stream of heated carrier gas, vaporized organic material can be transported through a tube and out of nozzle 125. In conventional applications, substrate 130 is moved relative to nozzle 125 in order to deposit a desired pattern. Typical deposited film thicknesses range from between 10 nm to 200 nm when applied to OLED applications; however, there are no fundamental limits on the range of deposited film thicknesses when utilizing this technique.

Figure 2A:
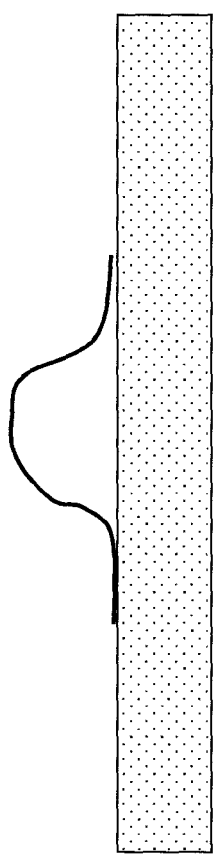
Figure 2B:
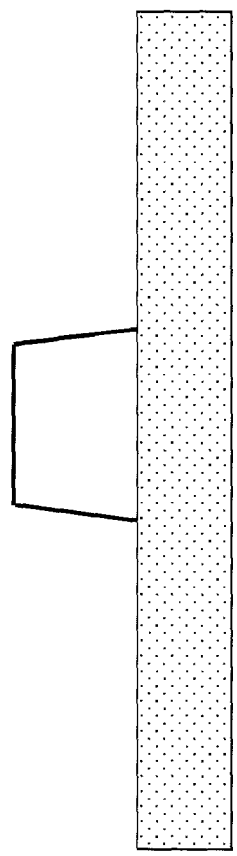

The single orifice nozzle 125 produces an approximately Gaussian shaped film profile as shown in FIG. 2A. The Gaussian shaped film profile typically does not have a uniform thickness over the target print region (unless the target print region is confined to a very narrow portion in the middle of the deposited area, which is usually impractical.) Multiple overlapping passes are needed with a very narrow print stream to approximate a flat region with sharp sidewalls (profiled edge) as shown in FIG. 2B. However, such overlapping techniques are slow, expensive and prone to error given the tight mechanical alignment and tolerance required. It is also difficult to create a print stream that is sufficiently narrow to get sharp edge profiles at the edge of the printed region.

Figure 3:
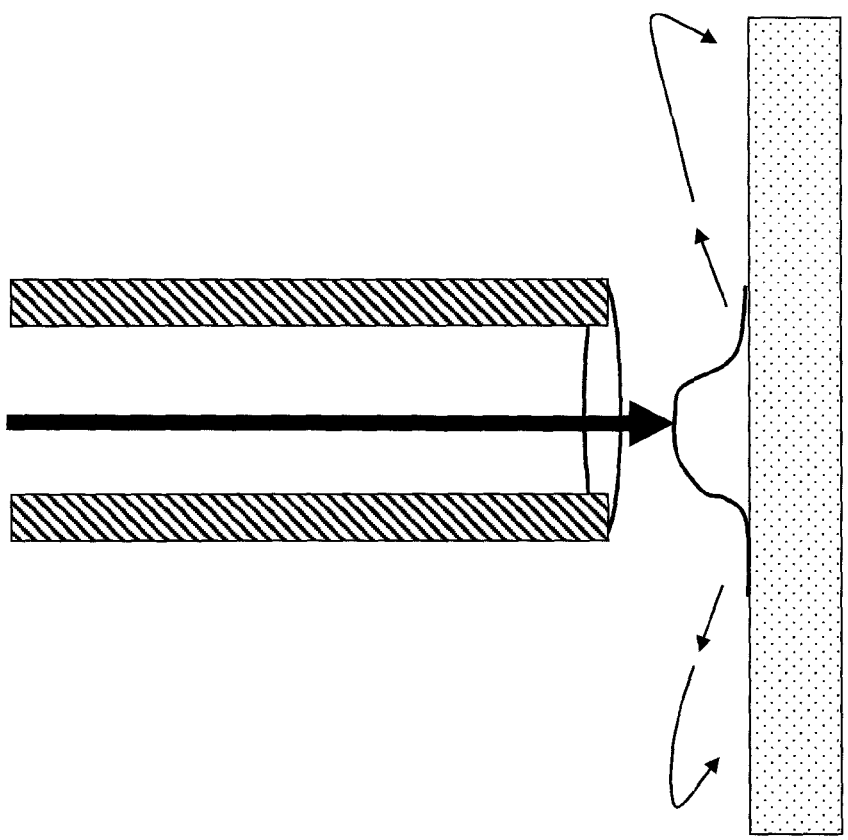

In addition, due to the high temperature and flow rate of the carrier gas, not all the material deposits on the substrate directly. Instead, the material bounces off the substrate and flows laterally, eventually depositing on the substrate far from the desired region as illustrated in FIG. 3. This contamination of the substrate renders the conventional techniques unattractive for any production, much less a large scale production.

Figure 4:
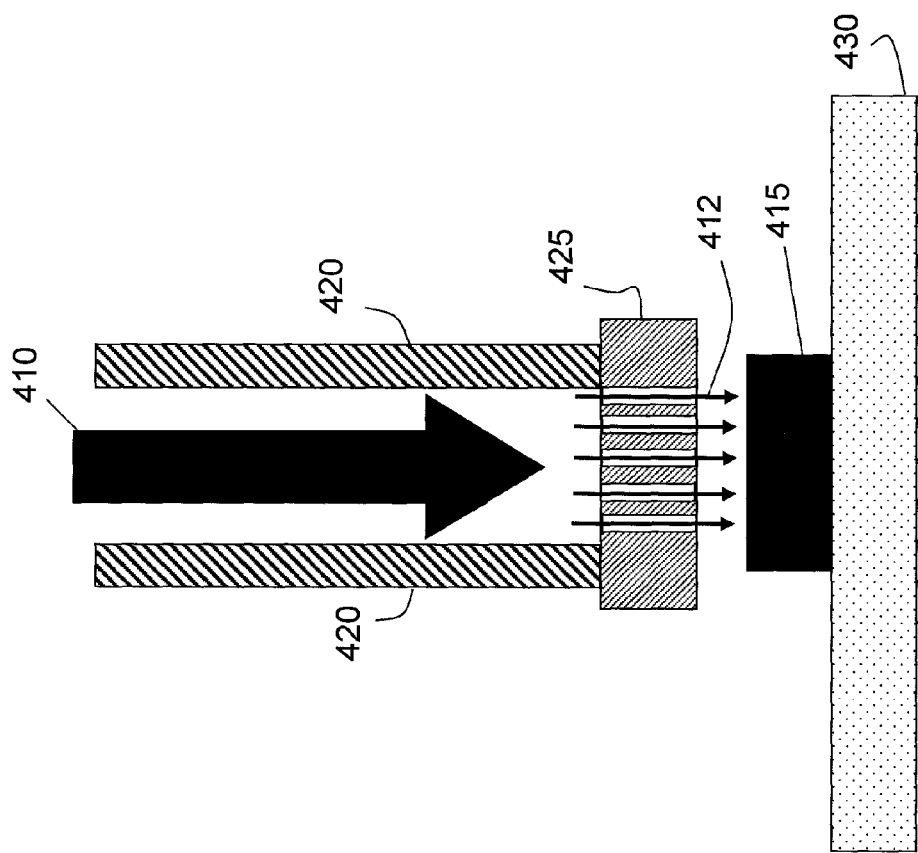

FIG. 4 shows a multipore nozzle according to one embodiment of the disclosure. In FIG. 4, gas stream 410 is a hot gas carrying organic vapor material to be deposited on substrate 430. Gas steam 410 is transported through conduit 420 to multipore nozzle 425. Multipore nozzle 425 divides stream 410 to multiple sub-streams 412. Each sub-stream 412 includes the carrier gas and vapor organic material. Sub-streams 412 deposit film layer 415 on substrate 430. Film layer 415 has the desired profiled edges. Film 415 also has a substantially uniform thickness. Finally, multipore nozzle 425 prevents lateral contamination of organic vapor material across the substrate.

The multipore nozzle can be fabricated using conventional techniques. In one embodiment of the disclosure, the multipore nozzle was fabricated using MEMS fabrication techniques by forming very small pore (orifice) arrays and by depositing very small features. The pores and the features typically have a diameter of between 1-10 µm, though pore sizes of up to 100 µm are possible. The small, micron-scale size of the pores enable excellent film deposit uniformity and profiled edges (sharp sidewall).

Figure 5C:
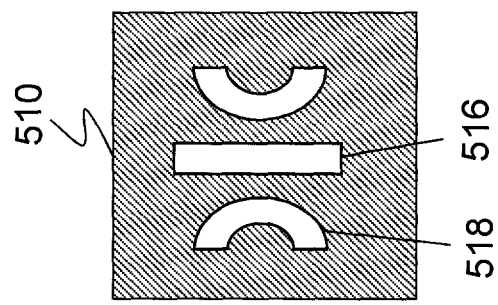
Figure 5B:
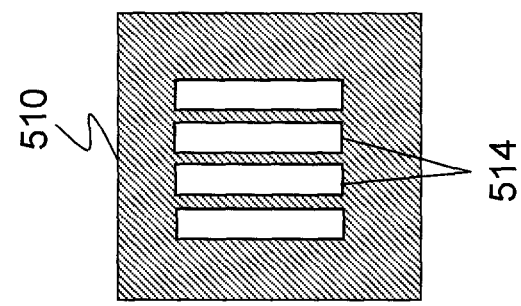
Figure 5A:
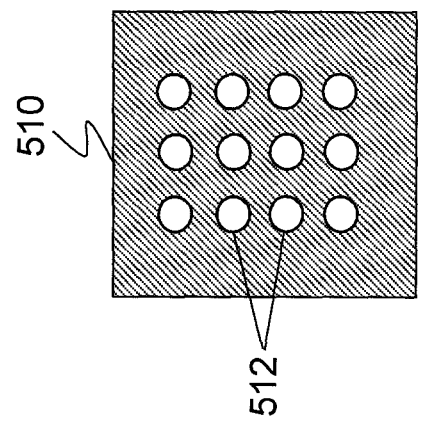

FIGS. 5A-5C show several exemplary pore patterns. In FIG. 5A, the circular pores are arranged in an array. The multipore nozzle of FIG. 5A includes surface 510, having fabricated therein pores 512. Pores 512 are circular in shape and are arranged symmetrically about the nozzle. In FIG. 5B, pores 514 are rectangular in shape and in FIG. 5C, rectangular pore 516 is supplemented by semi-circular pores 518 on each side. FIGS. 5A-5C illustrates that the shape of the pores can be designed to accommodate a number of shapes and orientations to accommodate different engineered deposited patterns and related film cross sections. The nozzles of FIGS. 5A-5C can be fabricated using conventional fabrication techniques such as MEMS.

Figure 6C:
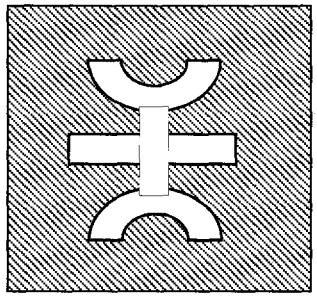
Figure 6B:
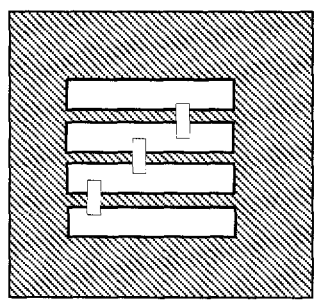
Figure 6A:
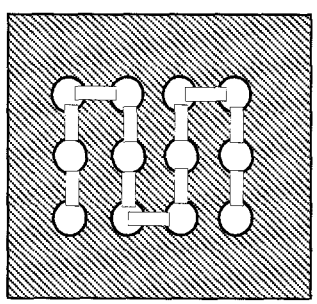

In certain applications it may be advantageous to convert the micropore patterns into a single continuous orifice (or several orifices) by strategically forming thin openings between two or more micropores. This structure is shown in FIGS. 6A-6C. Specifically, FIGS. 6A-6C show more complex pore patterns of multipore nozzles. Specifically, FIG. 6 shows patterns of connected pores, having circular (FIG. 6A), rectangular (FIG. 6B) or complex (FIG. 6C) shapes. The shapes can be designed to provide different patterns and desired film cross sections.

Figure 7:
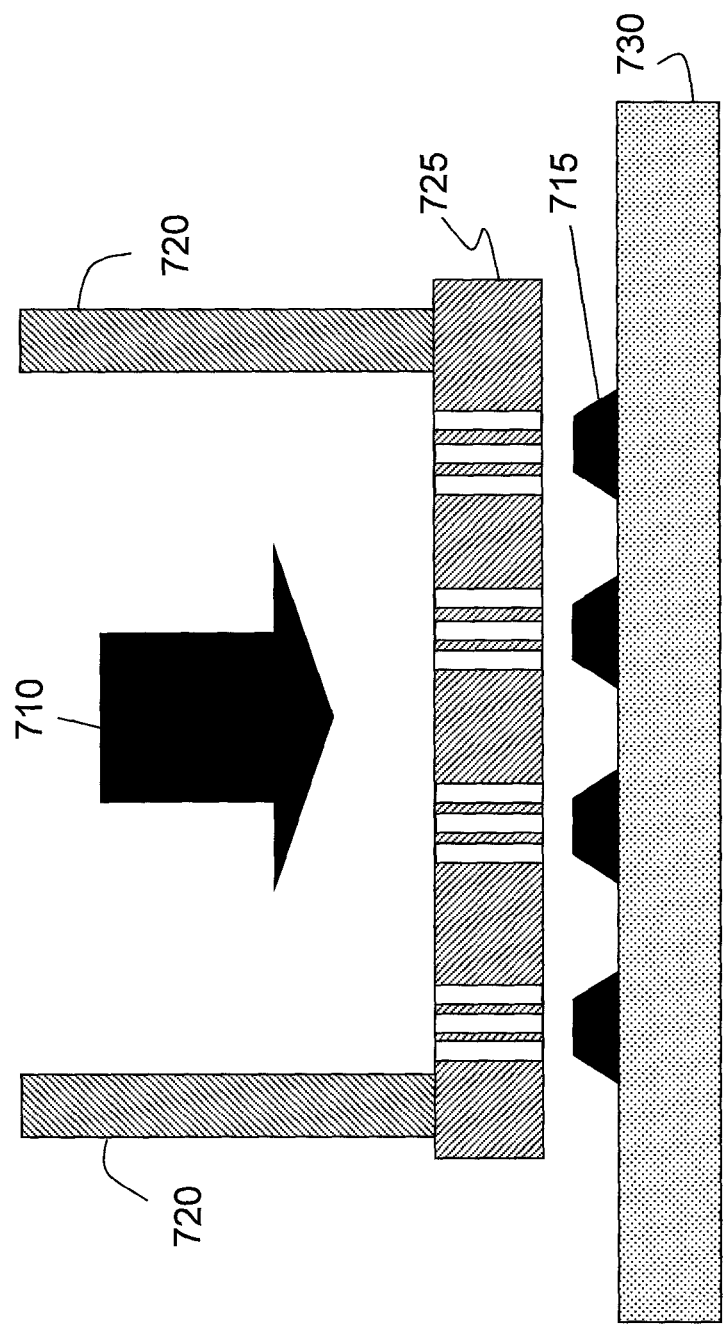

FIG. 7 illustrates an exemplary array of multipore nozzles. In FIG. 7, substrate 730 is positioned across an array of multipore nozzles 725 which deposit discrete films 715 from stream 710. Stream 710 can have a hot carrier gas containing vaporized organic material. Each deposited film segment has a profiled edge and a substantially uniform thickness. Conduits 720 can be integrated with the multipore array or can be separate. In another implementation of the disclosure, conduits 720 may be eliminated entirely. In still another embodiment, the multipore nozzles are designed as interface plates and are removably coupled to a discharge conduit. Several multipore nozzles can be arranged to form an array of nozzles. The neighboring multi-nozzle pores in the array need not have identical shapes.

Figure 8:
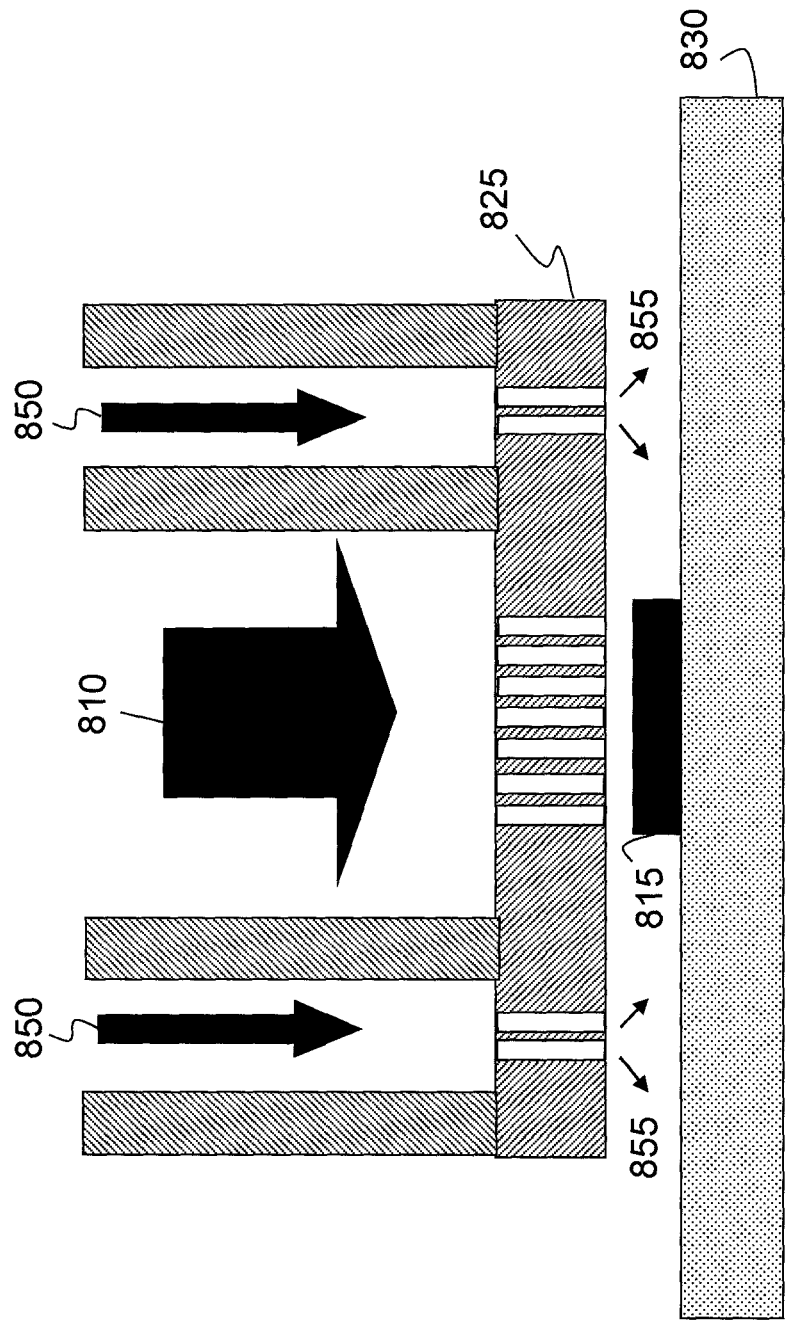

FIG. 8 shows an embodiment of the disclosure having auxiliary gas streams. In this embodiment, gas streams are positioned near the multipore nozzle in order to further rectify the shape of the vapor deposition. The auxiliary gas streams form an air curtain about the hot gas stream and further prevent lateral dissemination of organic vapor material. The auxiliary gas streams also help refining the profiled edge and the thickness of the deposited material. Referring to FIG. 8, first gas stream 810 defines a hot gas stream carrying vaporized organic material therein. The vaporized organic material can be ink composed for OLED application. Gas stream 810 can have a temperature in the range of about 150° C. to 450° C., with 300° C. being typical.

Gas stream 810 is directed to nozzles 825. Nozzle 825 includes several micropores which divide gas stream 810 into a corresponding number of sub-streams. Each sub-stream carries a quantity of vaporized organic material. The sub-streams are then directed to substrate 830. Substrate 830 can have a temperature lower than that of the first gas stream, allowing the vaporized organic material to condense on the surface thereof.

Simultaneous with the deposition process, auxiliary gas stream 850 is directed through corresponding micropores of nozzle 825 to form auxiliary sub-streams 855. The auxiliary sub-streams can have a lower temperature than gas stream 810 and may contain no vapor organic material. The auxiliary gas stream can be, for example, a noble gas. Depending on the location of the micropores, auxiliary gas streams 855 can form a fluid (or gas) curtain about the target deposition area. The fluid curtain can form a profiled edge and a substantially uniform thickness for the condensed organic vapor material 815. The cool gas curtain also prevents lateral spreading of the organic vapor material.

Figure 9:
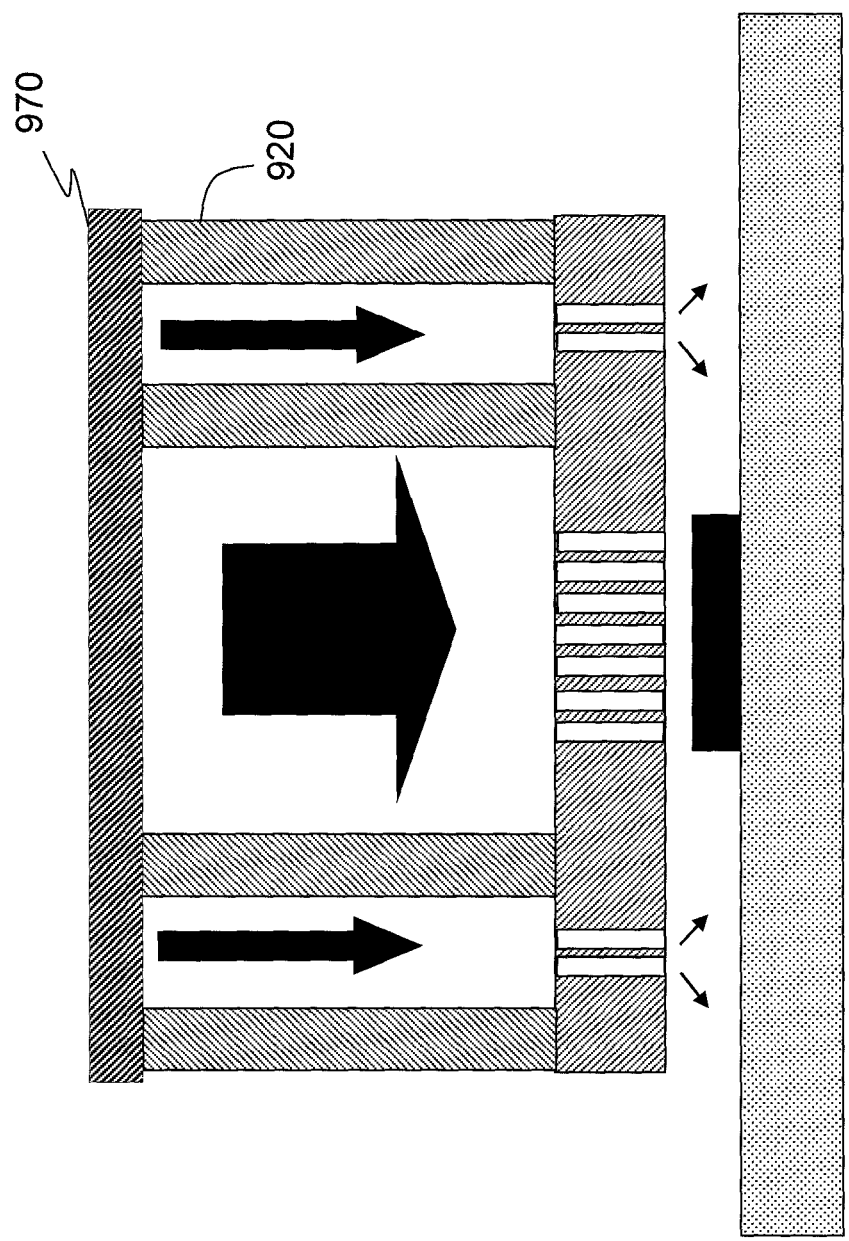

FIG. 9 illustrates a multipore nozzle with a gas curtain according to one embodiment of the disclosure. The embodiment of FIG. 9 is substantially similar to that of FIG. 8, except for the addition of interface plate 970 above conduit 920.

Figure 10:
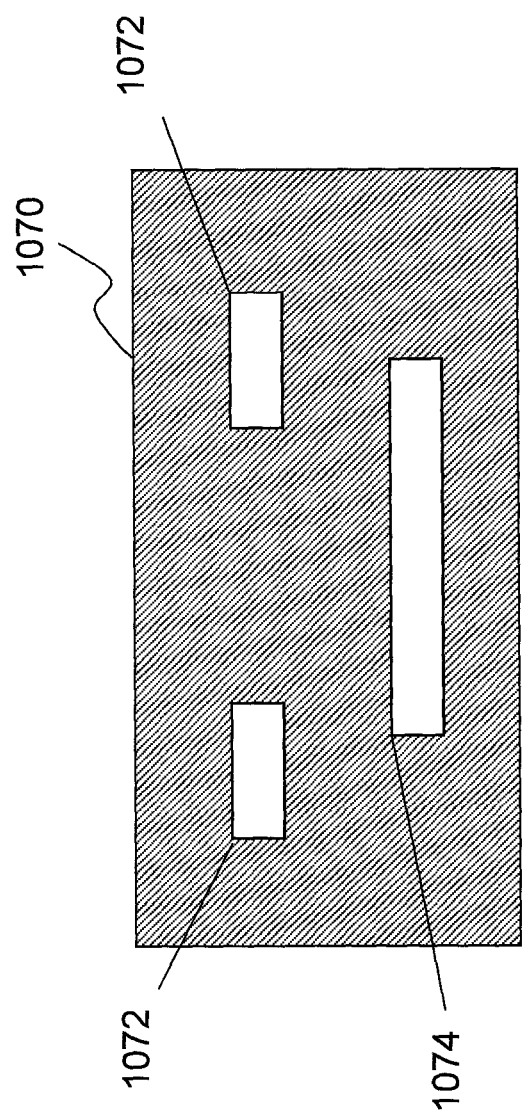

FIG. 10 is a cross-sectional view of the interface plate of FIG. 9. As shown in FIG. 10, auxiliary gas inlet 1072 which forms the fluid curtain is offset from hot carrier gas inlet 1074. The hot carrier gas inlet contains organic vapor material and can have a substantially higher temperature than the auxiliary gas. Inlets 1072 and 1074 can be fabricated easily on surface 1070 using techniques such as mechanical milling or chemical etching. The inlets 1072 and 1074 on interface plate 1070 can be replicated or reconfigured to produce multipore discharge nozzles or arrays thereof. Using interface 1070, gas delivery system can be reduced to a simple supply line (or conduit) having two inlets. A first inlet delivers cool auxiliary gas for the fluid curtain and the second inlet delivers hot carrier gas containing organic vapor material. The interface plate provides a cost-efficient means for integrating the first and second inlet streams with a multi-nozzle discharge device.

Figure 11:
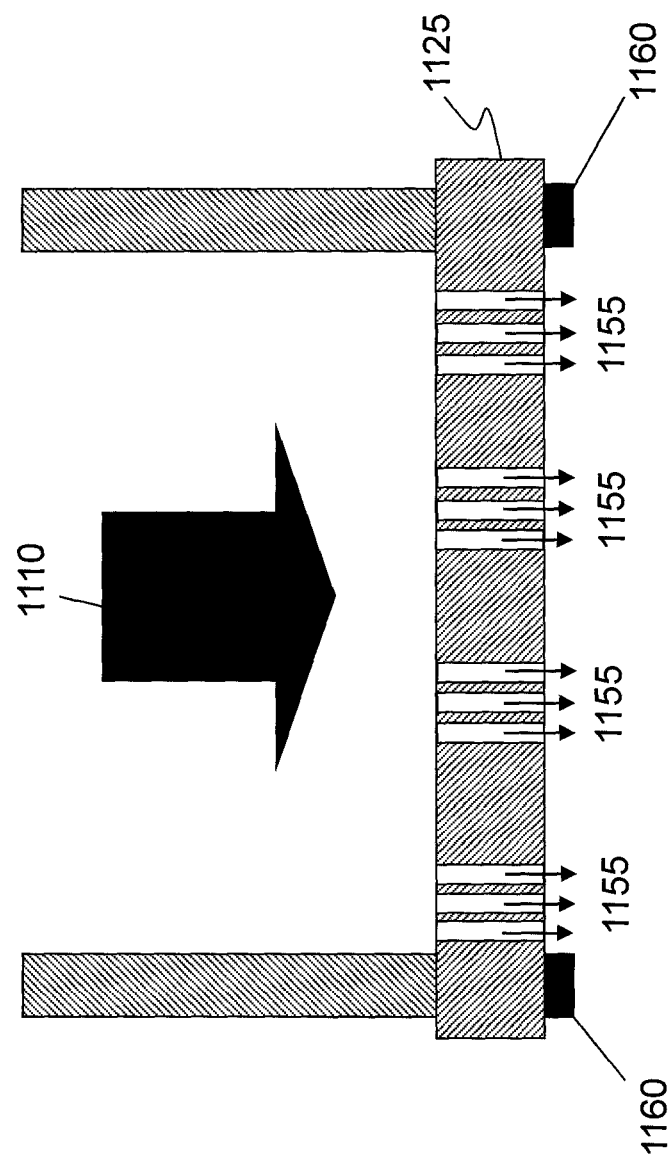
Figure 12:
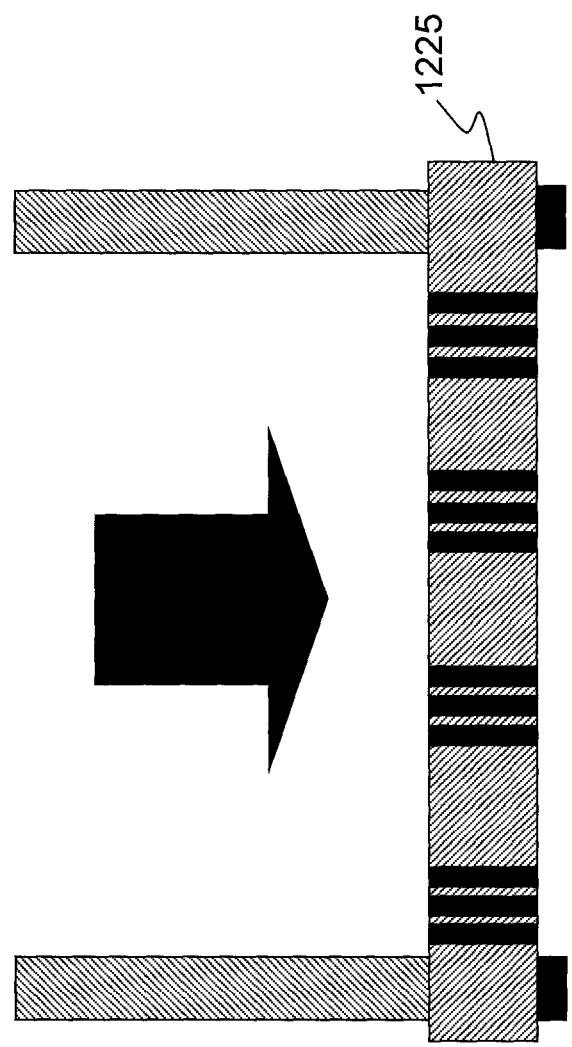

FIG. 11 shows a multipore nozzle with a thermal shutter according to another embodiment of the disclosure. Here, element heating units 1160 are added to multipore nozzle 1125. When the heaters are turned on, the pores are heated and hot gas 1110 is transmitted through the nozzle as shown by arrows 1155. On the other hand, when heaters are in the off state, the organic vapor material condenses on the interior surfaces of the pores and the flow is obstructed. This condition is shown in FIG. 12 where pores of nozzle 1225 are obstructed after the hot organic vapor condenses inside the cool pores. Because of the small size of nozzle 1225, an elemental heater can be effective for rapidly heating and cooling the system. Additional means, such as heat sink (not shown) can be added to the system to provide for faster cooling. The heating means can provide one or more of convection, conduction and/or radiation heating.

To control the rapidly changing temperature of the pores, a controller can be used. The controller can have one or more microprocessor circuits connected to one or more memory circuits. In addition, a flow regulator can be incorporated in the system to communicate with the controller. The flow regulator can optionally increase or decrease the hot gas flow rate (1110 in FIG. 11) according to whether heaters 1160 are on or off. The memory circuit can contain instructions for running the processor circuit and for starting and stopping the heater and/or the regulator.

By integrating a heating element and then modulating the heat applied to the multipore nozzle (or directly to the pores), the flow of organic vapor material through the nozzles can be modulated. When the heater is on, the material flows through the micropores without condensing on the micropore walls. When the heater is off (with optional support from a heat sink), the micropores are cool enough that the material condenses on the walls instead of passing through.

The disclosed embodiments can be combined to further control the film thickness, uniformity and the profiled edge. For example, a nozzle heater and the fluid curtain can be used conjunctively to further control deposition thickness and profile. Alternatively, the fluid curtain can be activated only when the heater is on to further enhance deposition profile. Both the nozzle heater and the fluid curtain can be combined with a multipore nozzle to provide even more accuracy and control over film deposition profile.

Figure 13:
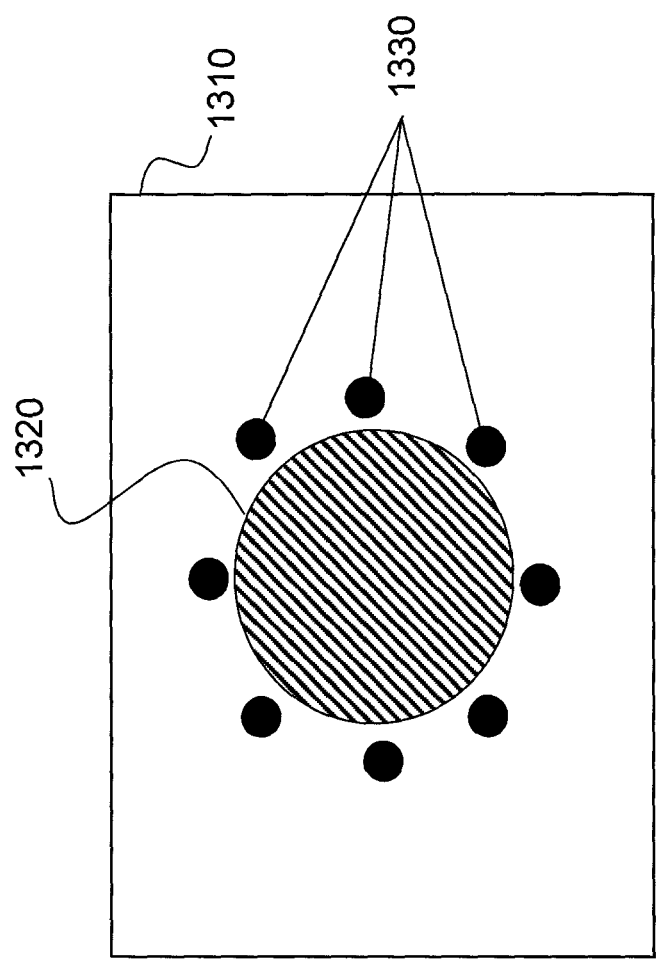

FIG. 13 shows an exemplary nozzle having multiple orifices for a fluid curtain. Specifically, FIG. 13 A shows structure 1310 having circular nozzle 1320 at the center thereof and pores 1330 distributed around the nozzle. Here, nozzle 1320 has one outlet port and pores 1330 provide a fluid curtain to the organic vapor film deposited through structure 1310. A heater may optionally be added to structure 1310. It is noted that nozzle 1320 can be replaced with a multipore nozzle according to the instant disclosure. At least two micropores 1330 can be connected by a cavity to provide a different fluid curtain profile as shown with reference to FIG. 6.

Figure 14:
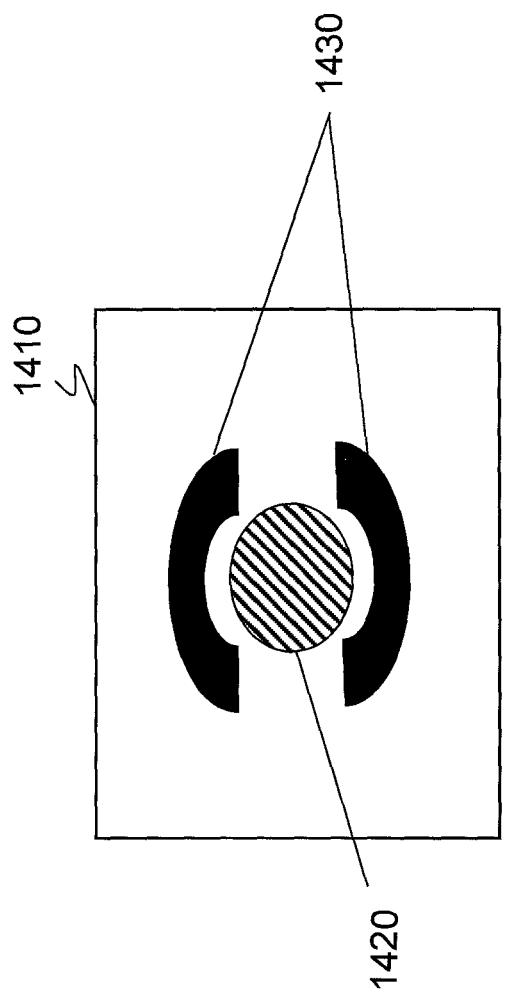

FIG. 14 shows another exemplary nozzle 1410 with apertures for forming a fluid curtain. In FIG. 14, circular nozzle 1420 is positioned between fluid ducts 1430. The organic vapor material which is conveyed through nozzle 1420 is surrounded by a fluid curtain provided by ducts 1430. The exemplary structure shown in FIG. 14 can be replicated to form a large array containing multiple nozzles 1420 surrounded by ducts 1430.

Figure 15:
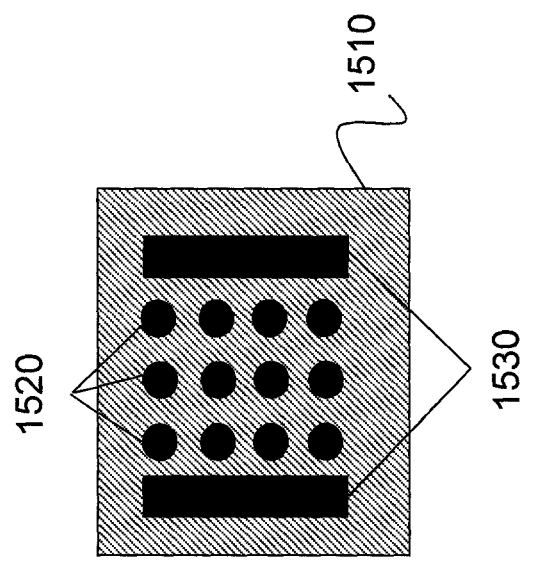

FIG. 15 shows exemplary discharge structure 1510 having multipore nozzles 1520 and ducts 1530. Ducts 1530 form a fluid curtain which delimits vapor organic material dispersion beyond a targeted print region. As with the previous embodiments, discharge structure 1510 can be formed in an array to provide for large area deposition. A heating apparatus may further be added to the embodiment of FIG. 15. Finally, it is noted that pores 1520 need not be circular and can assume any shape or form to accommodate the printing requirements.

Figure 16:
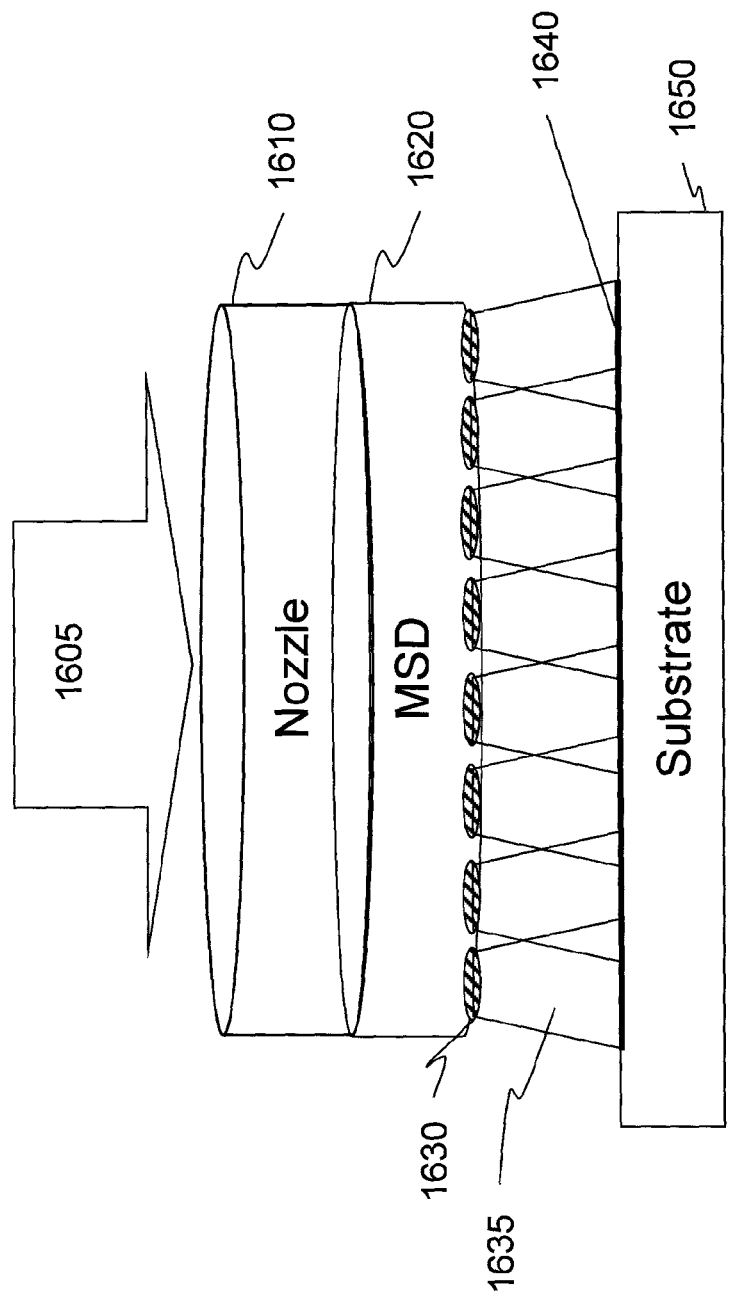

FIG. 16 shows an exemplary embodiment in which the micropores provide overlapping deposits. In FIG. 16, hot carrier gas stream 1605 is directed through nozzle 1610 to microscale distributor 1620. Nozzle 1610 and distributor 1620 can be integrated into one unit. Alternatively, they can be built separately so that different distributors can be assembled to different nozzles. Microscale distributor 1620 distributes stream 1605 into a plurality of sub-streams through a plurality of micropores 1630. Micropores 1630 can be organized such that the vapor stream from each micropore 1630 simultaneously delivers an overlapping deposit 1640 to substrate 1650. In one embodiment, the cross section of the deposit from a single microscale distributor has a continuous, non-zero cross section 1635 that can be controlled through the design of the size, shape and pattern of micropores 1630. The organic vapor streams form film 1640 which has substantially uniform thickness. The embodiment of FIG. 16 overcomes many of the deficiencies of the conventional methods by replacing a single continuous orifice nozzle by a plurality of microscale orifices (which may not necessarily be circular). Positioning a fluid curtain at the nozzle can further refine the edges of deposit layer 1640 according to the embodiments disclosed above.

While the principles of the disclosure have been illustrated in relation to the exemplary embodiments shown herein, the principles of the disclosure are not limited thereto and include any modification, variation or permutation thereof.

What is claimed is:

1. A method for printing a plurality of discrete film segments of substantially uniform thickness over a target print area, comprising:
    providing an array of multipore nozzles, wherein each multipore nozzle is fabricated to have a plurality of micropores arranged in a pattern and further wherein each multipore nozzle is configured to deposit a discrete film segment over the target print area;
    directing a gas stream comprising a carrier gas carrying a vaporized material through the array of multipore nozzles, wherein the gas stream is divided into a plurality of micron-scale gas sub-streams by the plurality of micropores in the multipore nozzles, each gas sub-stream comprising the carrier gas carrying the vaporized material;
    directing the gas sub-streams comprising the carrier gas carrying the vaporized material onto a substrate; and
    condensing the vaporized material on the substrate to form a plurality of substantially solid discrete film segments;
    wherein the plurality of micron-scale gas sub-streams from each multipore nozzle are positioned relative to each other to deposit a discrete film segment having a substantially uniform film thickness profile over the target print area.

2. The method of claim 1, wherein the vaporized material further comprises an organic ink.

3. The method of claim 1, wherein the substrate has a temperature lower than the gas stream temperature.

4. The method of claim 1, wherein the plurality of gas sub-streams are independent of each other.

5. The method of claim 1, wherein the vaporized material is substantially insoluble in the gas stream.

6. A method for printing a plurality of discrete film segments of uniform thickness profile, comprising:
    providing a multipore nozzle having a plurality of fabricated micropores, the plurality of fabricated micropores comprising:
    a first set of micropores, said first set of micropores in fluid communication with a first gas stream comprising a carrier gas and a quantity of organic material that is carried by the carrier gas; and
    a second set of micropores, wherein the second set of micropores are proximal to the first set of micropores and in fluid communication with a second gas stream;
    directing the first gas stream through the first set of micropores, wherein the first gas stream is divided into a plurality of gas sub-streams by the first set of micropores, each gas sub-stream comprising the carrier gas carrying the organic material;
    forming a pattern of a plurality of discrete film segments over a target print area on a substrate, such that each of the plurality of film segments in the pattern is configured to define one of the colors red, green or blue in a color pixel suitable for use in an OLED display, wherein each of the plurality of discrete film segments in the pattern is formed in the target print area by:
    directing the gas sub-streams comprising the carrier gas carrying the organic material onto the target print area, wherein the gas sub-streams have a higher temperature than the substrate to thereby condense the organic material in the target print area; and
    directing the second gas stream through the second set of micropores to form auxiliary gas sub-streams that form a gas curtain about the gas sub-streams comprising the carrier gas carrying the organic material, wherein the gas curtain contacts the edge of the discrete film segment such that the discrete film segment is formed with a substantially sharp sidewall.

7. The method of claim 6, wherein the auxiliary gas sub-streams are parallel to the gas sub-streams comprising the carrier gas carrying the organic material.

8. The method of claim 6, wherein the auxiliary gas sub-streams are at an angle with respect to the gas sub-streams comprising the carrier gas carrying the organic material.

9. The method of claim 6, wherein the second gas stream is cooler than the first gas stream.

10. The method of claim 6, wherein the second gas stream has an inert composition.

11. The method of claim 6, wherein the target print area moves relative to the first gas stream.

12. The method of claim 6, wherein the organic material is substantially insoluble in the first gas stream or the second gas stream.

13. The method of claim 6, further comprising directing the auxiliary gas sub-streams to the target print area at an angle to deposit a substantially uniform layer of organic material.

14. The method of claim 1, wherein each of the plurality of micropores fabricated in the nozzle have a diameter of between 1 µm to about 10 µm.

15. The method of claim 1, wherein the plurality of micropores fabricated in the nozzle provide uniform film thickness of the solid film formed.

16. The method of claim 1, wherein the selection of the size, shape and pattern of the plurality of micropores fabricated in the nozzle controls film deposition.

17. The method of claim 1, wherein vaporized material flows through the micropores without condensing on the micropore walls.

18. The method of claim 6, wherein organic material flows through the micropores without condensing on the micropore walls.

19. A method for printing a plurality of discrete film segments having uniform thickness profiles, comprising:
    providing an array of multipore nozzles, each multipore nozzle having a plurality of fabricated micropores, the plurality of fabricated micropores comprising:
    a first set of micropores; and
    a second set of micropores, wherein the second set of micropores are proximal to the first set of micropores;
    directing a first gas stream through the first set of micropores in each multipore nozzle, the first gas stream comprising a carrier gas and a quantity of organic material that is carried by the carrier gas, wherein the first gas stream is divided into a plurality of gas sub-streams by the first set of micropores, each gas sub-stream comprising the carrier gas carrying the organic material; and forming a pattern of a plurality of discrete film segments over a target print area on a substrate, wherein the discrete film segments in the pattern are configured to define one of the colors red, green or blue in color pixel suitable for use in an OLED display, wherein each of the plurality of discrete film segments in the pattern is formed in the target print area by:

directing the gas sub-streams from the multipore nozzles onto the target print area, wherein the gas sub-streams have a higher temperature than the substrate to thereby condense the organic material into a plurality of discrete film segments in the target print area; and directing a second gas stream through the second set of micropores in each multipore nozzle to form auxiliary sub-streams that form a gas curtain about the gas sub-streams comprising the carrier gas carrying the organic material from each on the multipore nozzles, wherein the gas curtains contact the edges of the discrete film segments such that the discrete film segments are formed with substantially sharp sidewalls.

* * * * *